United States Patent
Krishnamoorthy et al.

(10) Patent No.: US 7,213,184 B2
(45) Date of Patent: May 1, 2007

(54) TESTING OF MODULES OPERATING WITH DIFFERENT CHARACTERISTICS OF CONTROL SIGNALS USING SCAN BASED TECHNIQUES

(75) Inventors: Nikila Krishnamoorthy, Bangalore (IN); Anindya Saha, Bangalore (IN); Rubin Ajit Parekhji, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 192 days.

(21) Appl. No.: 10/710,451

(22) Filed: Jul. 12, 2004

(65) Prior Publication Data

US 2005/0091562 A1 Apr. 28, 2005

Related U.S. Application Data (60) Provisional application No. 60/501,132, filed on Sep. 8, 2003.

(51) Int. Cl.
*G01R 31/28* (2006.01)
*H03K 19/096* (2006.01)

(52) U.S. Cl. .................. 714/729; 714/726; 714/731; 326/96

(58) Field of Classification Search .................. None
See application file for complete search history.

(56) References Cited

U.S. PATENT DOCUMENTS 6,742,151 B2 * 5/2004 Park et al. .................. 714/729
6,744,285 B2 * 6/2004 Mangum et al. .............. 326/96

* cited by examiner

*Primary Examiner*—Guy Lamarre
*Assistant Examiner*—John J. Tabone, Jr.
(74) *Attorney, Agent, or Firm*—Steven A. Shaw; W. James Brady; Frederick J. Telecky, Jr.

(57) ABSTRACT

Testing of modules (such as Intellectual property (IP) cores) in integrated circuits (such as system on a chip units (SOCs)) in situations when different modules operate with different characteristics of a control signal. In an embodiment, another module ("subsystem module") may be implemented to be tested with any of a multiple characteristics of a control signal, and a register which is programmable to generate a derived control signal of a desired characteristic from an original control signal, is provided. The derived control signal is provided to test the subsystem module. According to an aspect of the invention the desired characteristic may be determined, for example, to test a path between the two modules at the same speed as at which the path would be operated in a functional mode.

10 Claims, 5 Drawing Sheets

TESTING OF MODULES OPERATING WITH DIFFERENT CHARACTERISTICS OF CONTROL SIGNALS USING SCAN BASED TECHNIQUES

CROSS REFERENCE TO RELATED APPLICATIONS

The present application is related to and claims priority from co-pending U.S. provisional patent application entitled, "Comprehensive Scan and Clock Control Mechanism for ATPG of Complex SOCs Involving Multiple IP Cores", Filed on: Sep. 8, 2003, Ser. No. 60/501,132, naming as inventors: Nikila K et al, and is incorporated in its entirety herewith into the present application.

BACKGROUND OF INVENTION

1. Field of the Invention

The present invention relates to testing of integrated circuits, and more specifically to a method and apparatus for testing of modules operating with different characteristics of control signals using scan based techniques.

2. Related Art

Scan based techniques are often employed to test integrated circuits (ICs). In a typical scenario, memory elements (e.g., flip-flops) contained in an IC are connected in sequence, and a desired sequence of bits ("test pattern") is scanned into the memory elements in corresponding clock cycles. Automatic Test Pattern Generation (ATPG) techniques, wherein the test patterns for complex designs are generated automatically, often use such scan based techniques.

The combinatorial logic elements contained in the IC are then evaluated based on the scanned test pattern. The results thus generated may be stored in the corresponding memory elements. The generated outputs may be examined (potentially by scanning/shifting out the bits stored by the memory elements) to verify whether the IC operates in a desired manner.

Control signals are often used to control and coordinate the activities of various elements contained in an IC. For example, one logic level of a signal ("scan enable signal") may cause a test pattern (or results) to be shifted into (out of) memory elements ("shift mode"), and another logic level of the signal may then cause the evaluation/capture of outputs of the combinatorial logic ("capture mode").

Another example of a control signal is a clock signal, which controls the specific time instances at which the bits are scanned and evaluated. In general, the transitions are controlled by the occurrence of an edge (rising or falling) or upon a specific active state (logic high or logic low), as is well known in the relevant arts. For example, the scan enable signal transitions may be controlled on clock signal edges or clock signal levels. Merely for illustration, the description in the present application is provided assuming the transitions occur on edges.

ICs often contain modules, which generally refer to distinct units, typically provided for a specific purpose. For example, a module may operate as a random access memory, and another module may be implemented to process analog signals according to desired digital signal processing (DSP) techniques.

Different modules may be designed to operate with different characteristics of control signals during scan based tests. For example, one module may be designed to transition from one state to another on a rising edge of a clock signal and another module may be designed to transition on a falling edge of the clock signal. Similarly, one module may require change in levels of scan enable (SE) signal to be synchronous with a rising edge and another module may require change in levels of SE signal to be synchronous with a falling edge of the clock signal.

Such differences in operation of modules can be due to various reasons. For example, a designer of a system on a chip (SOC) may use modules (often referred to as "intellectual property cores", IP cores) provided by third parties, who may design their respective modules to operate with different characteristics of control signals during testing using scan based techniques.

It is often desirable that integrated circuits be tested using scan based techniques even in situations when different modules operate with different characteristics of control signals. In particular, in a SOC type scenario in which different IP cores may be provided by different designers with potentially different characteristics of the control signals, it is desirable that the SOC be tested comprehensively.

In one prior approach, each module is tested in isolation by providing corresponding control signals with different characteristics. Since each module is tested in isolation, control signals may be generated with corresponding characteristics. Accordingly, all modules of an integrated circuit may be tested at least to some extent, even if the modules operate with different characteristics.

Several disadvantages may be presented due to such a prior approach. For example, the cross module operation (i.e., output generated by one module being used by another module) may not be tested in such an approach. As a result, the approach may also not be able to test the interconnect paths between the modules at the speed at which the paths are likely to be operated in an application use scenario.

Additional challenges may be presented to designers using of ICs modules from potentially different vendors (i.e., IP cores being available from different vendors). Typically, a designer of an IP core designs the corresponding circuit ahead of the time an SOC designer designs the SOC, hence the IP core designer may not know the specific characteristics of the control signals with which the multiple IP cores in an SOC would operate. As a result, the SOC designer cannot influence/change the characteristics of the control signals required for testing individual IP cores.

An SOC designer may attempt to design the test related circuits consistent with the design of an IP core. Unfortunately, different IP cores may present conflicting requirements with respect to the characteristics of the control signals and different portions provided by the SOC designer may need to inter-operate with several such IP cores. As a result, cross module testing may again pose challenges.

At least for components such as SOCs to be tested as comprehensively as possible, an approach is needed which allows testing of modules operating with different characteristics of control signals using scan based techniques (at least for reasons noted above).

BRIEF DESCRIPTION OF DRAWINGS

Various features of the present invention will be described with reference to the following accompanying drawings.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An aspect of the present invention provides a programmable field, which can be optionally set to a value to alter the characteristic of a control signal ("original control signal") and provide the resulting derived control signal. If the field is set to a different value, the derived control signal may have the same characteristic as the original control signal. Such a feature may be conveniently used to test in parallel modules operating with different characteristics of the control signals as described below with examples.

A designer of an SOC may implement a module ("subsystem") which can be tested with any of multiple characteristics of control signals. While using modules ("IP cores" or simply "cores") designed by third parties, the programmable fields may be used associated with the subsystems such that derived control signals are generated to test paths between modules at the same speed as the speed at which the paths would be operated in a functional mode.

As a result, both the modules are tested simultaneously (in parallel) as well. It may thus be appreciated that a SOC may be tested with IP cores operating with different characteristics potentially simply by programming the programmable fields to corresponding values. In addition, the same subsystem may be operated with control signals of one char-acteristic to test a path connecting one IP core module, and with another characteristic to test a path connecting to another IP core module.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well_known structures or operations are not shown in detail to avoid obscuring the invention.

2. Example Environment

Figure 1:
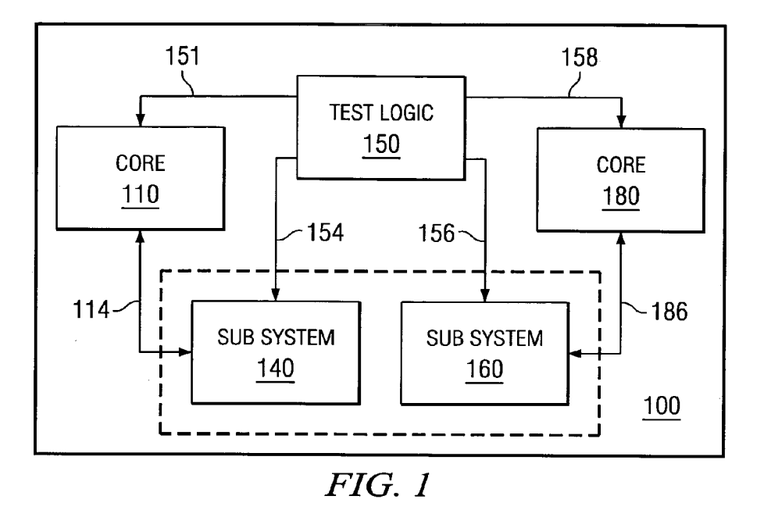
FIG. 1 is a block diagram of an integrated circuit (IC) illustrating an example environment to implement several aspects of the present invention.

FIG. 1 is a block diagram of integrated circuit (IC) 100 illustrating an example environment in which several aspects of the present invention can be implemented. IC 100 is shown containing only a few modules, however, ICs implementing various aspects of the present invention may contain more types of and number of modules. IC 100 is shown containing IP cores: core modules 110 and 180, subsystem modules 140 and 160, and test logic 150. Each block is described in detail below.

Broadly, core modules 110 and 180 represent complex modules, which can be provided by third parties. Subsystem module 140 represents a module designed by a designer of IC 100, which interfaces with core module 110 according to pre-specified interfaces on path 114. Core module 180 may similarly interface with subsystem module 160 on path 186.

Core modules 110 and 180 represent modules which can be tested using control signals having pre-specified characteristics only. Such pre-specified characteristics can be different for IP cores provided by different vendors. In addition, the characteristics can be different for operation in functional mode and test mode. An aspect of the present invention enables such core modules also to be tested in parallel along with subsystem modules as described below in further detail.

Subsystem modules 140 and 160 represent example modules, each of which can be tested using signals having any of multiple characteristics. The subsystems may be designed by a designer of SOC, and thus the designer may have control in implementing such modules.

Test logic 150, provided according to an aspect of the present invention, is programmable to generate control signals with any desired characteristics. Thus, once the characteristics of core modules 110 and 180 are known (e.g., at the time of defining the tests), test logic 150 may be programmed to generate the control signals of desired characteristics for the subsystems. The characteristics may be designed to test the paths at the same speed as at which the paths would be operated in a functional mode, when IC 100 is placed in an application use environment (as described below with reference to several examples).

The control signals are shown provided to core module 110, subsystem module 140, subsystem module 160 and core module 180 respectively on paths 151, 154, 156, and 158. The manner in which test logic 150 may be implemented is described in sections below with examples.

Various aspects of the present invention enable the modules to be tested in parallel and at correct speeds (at-speed) irrespective of the characteristics of the control signals required to test core modules 110 and 180. The features are illustrated considering only small portions of example embodiments of core module 110 and subsystem module 140 as described below.

3. Core Module and Subsystem Module

Figure 2:
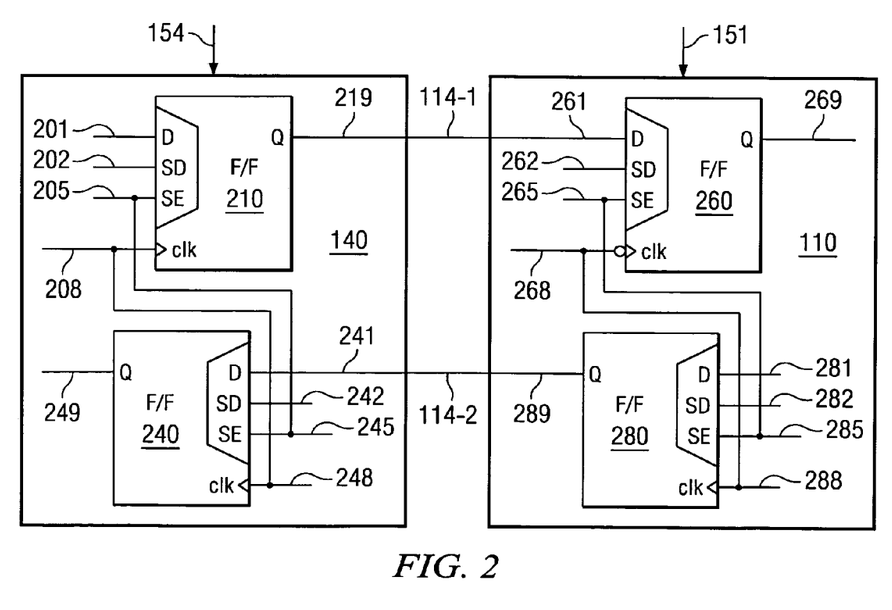
FIG. 2 is a circuit diagram depicting a portion of the internals of a core module and subsystem module as relevant to an understanding of several aspects of the present invention.

FIG. 2 is a circuit diagram depicting a portion of the internals of core module 110 and subsystem module 140 as relevant to an understanding of several aspects of the present invention. Each of subsystem module 140 and core module 110 are respectively shown containing only two scan flip-flops (210 and 240), and (260 and 280). Merely for illustration, each block is shown containing two flip-flops, however typical blocks contain substantially more complex circuitry. Each block is described below in further detail.

Each scan flip-flop may be viewed as a combination of a multiplexer and a flip-flop, as depicted in FIG. 2. Each scan flip-flop may contain scan data (SD), data (D), clock (clk), and scan enable (SE) as inputs, and an output Q. The D-inputs of each of scan flip-flops 210, 240, 260 and 280 may be connected to a corresponding combinational logic (not shown) on respective paths 201, 241, 261, and 281.

Scan flip-flop 210 is shown receiving clk208 (clock signal), SE205 and D201 on paths 154-1, 154-2, and 154-3 (connection not shown) contained in bus 154. The same clock and scan enable signals are respectively provided as clk248 and SE245 to flip-flop 240. The D-input (D241) of flip-flop 240 is connected to output Q289 of flip-flop 280 on path 114-2.

Similarly, flip-flop 260 is shown receiving clk268 (clock signal), and SE265 on paths 151-1 and 151-2 (connection not shown) contained in bus 151. The D-input (D261) of flip-flop 260 is connected to output Q219 of flip-flop 210 on path 114-1. The D-input (D281) of flip-flop 280 is provided on path 151-3 (contained in bus 151), clk288, and SE285 may be connected to paths 151-1 and 151-2. Outputs Q269 and Q249 may be observed to verify whether core module 110 and subsystem module 140 operate in a desired manner.

As noted above, various aspects of the present invention enable the modules to be tested in parallel irrespective of the characteristics of the control signals required to test core modules 110 and 180. Such a feature may be appreciated by first understanding the manner in which a path may be over tested or under tested when is a mis-match of the characteristics of control signals. The description is continued with respect to under-testing.

4. Under-Testing of Paths in Case of Mis-match of Characteristics

Under-testing in turn may be appreciated by first understanding the duration present for a signal to be transferred in a functional mode (in which the IC would be used in application use after testing), and then comparing the corresponding duration that would be present when there is a mis-match of characteristics between the two modules. Accordingly, the operation in functional mode is described below first with reference to FIG. 3A.

Figure 3A:
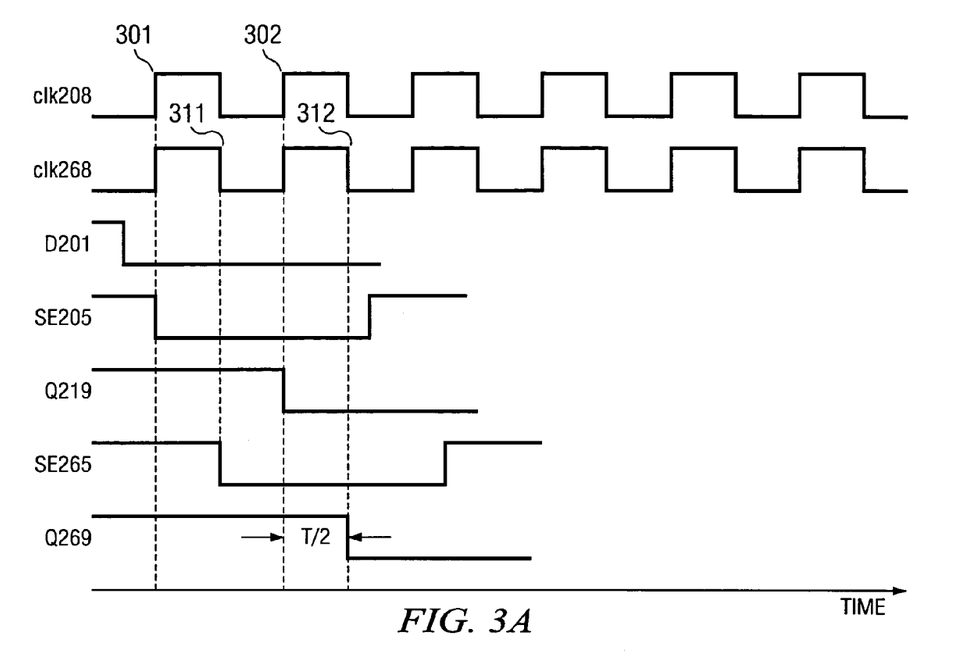
FIG. 3A is a timing diagram of various signals depicting time/duration available for an interconnecting path connecting subsystem module to core module operating with different characteristics of control signals to transfer data in functional mode.

FIG. 3A is a timing diagram of various signals depicting time/duration available for an interconnecting path 114-1 connecting subsystem module 140 to core module 110 operating with different characteristics of control signals to transfer data in functional mode. Various signals and the timing relationship of the signals are described below.

In functional mode, both clk208 (corresponding to path 208) and clk268 (of path 268) represent positive (010) clock signals (i.e., transitions occur on rising edge), SE205 (scan enable input for subsystem module 140) and SE265 (scan enable input for core module 110) change to logic low on the rising edge of clk208 (at time point 301) and falling edge of clk268 (at time point 311) respectively.

At time point 301, SE205 is shown changing from logic 1 to 0 causing scan flip-flop 210 to capture the input data (D201), and provide the captured data Q219 (as output) at time point 302 (next rising edge of clk208).

At time point 311, SE265 is shown changing from logic 1 to 0 causing scan flip-flop 260 to capture data D261 (equaling Q219, not shown) and provide Q269 (as output) at time point 312 (next falling edge of clk268). It may be observed that the time delay between time points 302 and 312 equals T/2 (assuming the duration of the two clocks equal T). Thus, T/2 represents the correct duration that would be available for an output signal to be provided on path 114-1 in a functional mode.

Figure 3B:
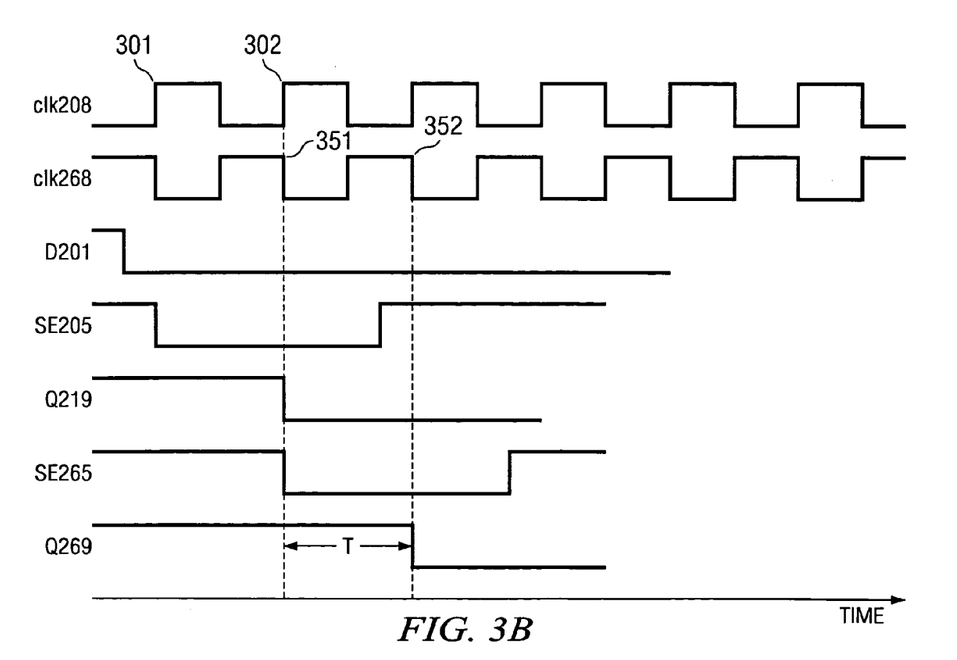
FIG. 3B is a timing diagram of various signals illustrating under-testing of a path transferring data from subsystem module to core module being tested at-speed, while operating with different characteristics of control signals.

The description is continued with a timing diagram illustrating the under-testing of path 114-1 (contained in bus 114) caused due to different characteristics of the control signals.

FIG. 3B is a timing diagram of various signals illustrating under-testing of a path transferring data from subsystem module 140 and core module 110 being tested at-speed, while operating with different characteristics of control signals. For conciseness, only the differences of FIG. 3B as compared to 3A are described below.

In test mode, for illustration, it is assumed that core module 110 operates on a negative clock (101, i.e., transition occur on falling edge) as compared to positive clock and the other characteristics of core module 110 and subsystem module 140 remain unchanged compared to the functional mode of FIG. 3A.

At time point 351 (falling edge of clk268), SE265 is shown changing from logic 1 to 0 causing scan flip-flop 260 to capture input data D261 (i.e., Q219) to be provided as output Q269 at time point 352 (as compared to time point 312 in FIG. 3A). The time delay between time points 302 and 352 equals T (as compared to T/2 in FIG. 3A). Increase in time delay from T/2 to T causes path 114-1 to be under-tested.

The description is continued with reference to a timing diagram of various signals illustrating over-testing (lesser duration available to a path to transfer the data than desired) of path transferring data from core module 110 to subsystem module 140 in case of another type of mis-match of characteristics of control signals.

5. Over-Testing of Paths

As with the description related to under-testing (FIGS. 3A and 3B), over-testing is also described first with functional mode operation and then testing (test mode) with different characteristics of the control signals causing over-testing. Thus, the time points at which the outputs are generated by flip-flops 280 and 240 operating in functional mode is described with reference to FIG. 4A, and then those of test mode are described with reference to FIG. 4B.

Figure 4A:
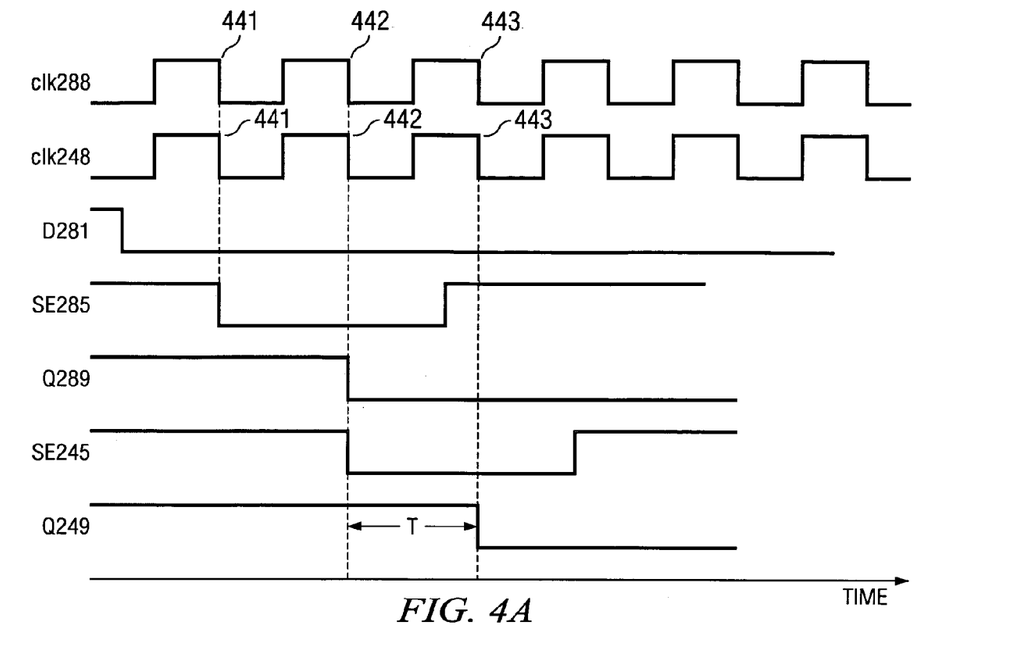
FIG. 4A is a timing diagram of various signals depicting time available for a path transferring data from core module to subsystem module in functional mode in an example scenario.

FIG. 4A is a timing diagram of various signals depicting time available for a path transferring data from core module 110 to subsystem module 140 in functional mode in an example scenario. Various relevant signals and the timing relationship between the signals are described below.

In the present illustrative example of functional mode, both clk288 (clock signal on path 288) and clk248 (clock signal on path 248) represent positive (010) clock signals (i.e., transitions on rising edges), and a transition to logic low of SE285 (SE signal on path 285) and SE245 (SE signal on path 245) change respectively on the falling edge of clk288 and clk248.

At time point 441, SE285 is shown changing from logic 1 to 0 causing scan flip-flop 280 to capture the input data (D281), and provide the captured data to output Q289 at time point 442 (next falling edge of clk288).

At time point 442, SE245 also changes from 1 to 0 and causes scan flip-flop 240 to capture/transfer input data D241 (equaling Q289) as output Q249 at time point 443 (next falling edge of clk288). The time delay between time points 442 and 443 in functional mode equals T (assuming duration of both clocks to equal T), which represents the correct duration in which an output path should be tested.

Figure 4B:
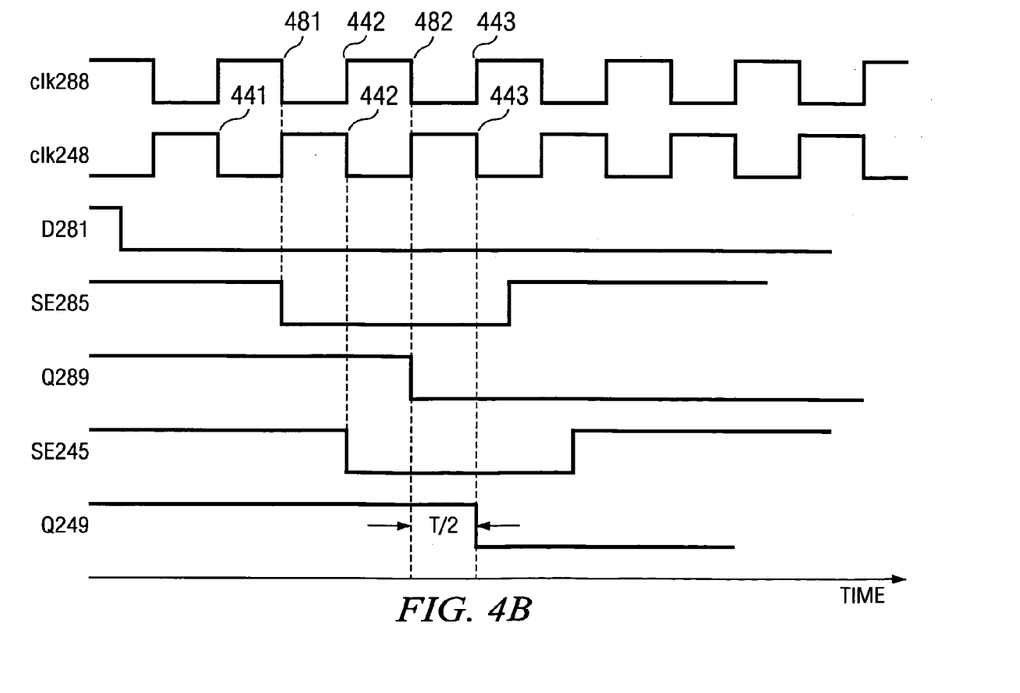
FIG. 4B is a timing diagram of various signals illustrating over-testing of a path transferring data from core module to subsystem module while operating with different characteristics of control signals.

The description is continued with a timing diagram illustrating the over-testing of path 114-2 (also contained in bus 114) caused due to change of characteristics of control signals.

FIG. 4B is a timing diagram of various signals illustrating over-testing of a path transferring data from core module 110 and subsystem module 140 while operating with different characteristics of control signals. For conciseness, only the differences of FIG. 4B as compared to 4A are described below.

In test mode, for illustration it is assumed that core module 110 operates on negative clock (101/inverted) as compared to positive clock in functional mode and the other characteristics remain unchanged (in comparison to FIG. 4A).

At time point 481 (falling edge of clk288), SE285 is shown changing from logic 1 to 0 and causes scan flip-flop 280 to capture input data D281, and to transfer the captured data to output Q289 at time point 482 (as compared to time point 442 in FIG. 4A).

As may be readily observed, the time delay between time points 482 and 443 equals T/2 (as compared to T in FIG. 4A). Such reduction in time delay from T to T/2 causes path 114-2 to be over-tested.

Thus, such approach(es) of testing modules operating with different characteristics of control signals are unacceptable at least in some scenarios.

Merely for illustration, the description is continued with reference to an example scenario in which core modules 110 and 180 can operate only with specific characteristics of control signals. Accordingly, the description is continued with the characteristics with which various modules can operate in such an example scenario.

6. Characteristics of Control Signals with which Modules can be Tested

Figure 5:
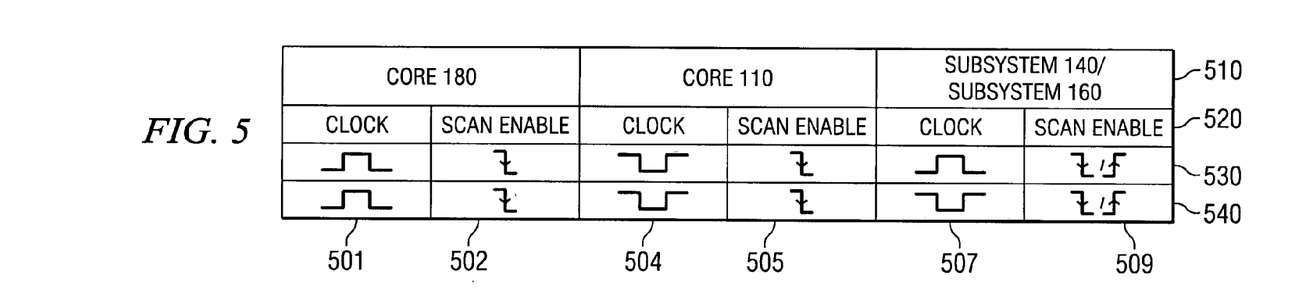
FIG. 5 is a table depicting different characteristics of control signals with which the modules of Figure Scan be tested in one embodiment.

FIG. 5 is a table depicting different characteristics of control signals with which the modules of Figure Scan be tested in one embodiment. Table 500 is shown containing two rows 530 and 540 and six columns 501 through 509.

Row 530 is shown depicting a positive clock (010) and falling edge triggered SE (in columns 501 and 502) corresponding to core module 180, a negative clock (101) and a falling edge triggered SE (in columns 504 and 505) corresponding to core module 110. A positive clock (in column 507) and a falling edge/rising edge triggered SE (column 509) is shown corresponding to a subsystem module 140/160.

Row 540 is shown depicting a negative clock (101) and a rising/falling edge triggered SE signal (in columns 507 and 509) corresponding to subsystem module 140/160. However, the clock and SE signal corresponding to core modules 110 and 180 remain unchanged (compared to entries in row 530), as the designer of IC 100 does not have control over the operation of the two cores. Also, it may be observed that the characteristics of control signals of core module 110 and subsystem module 140 in row 530 are different.

Figure 6:
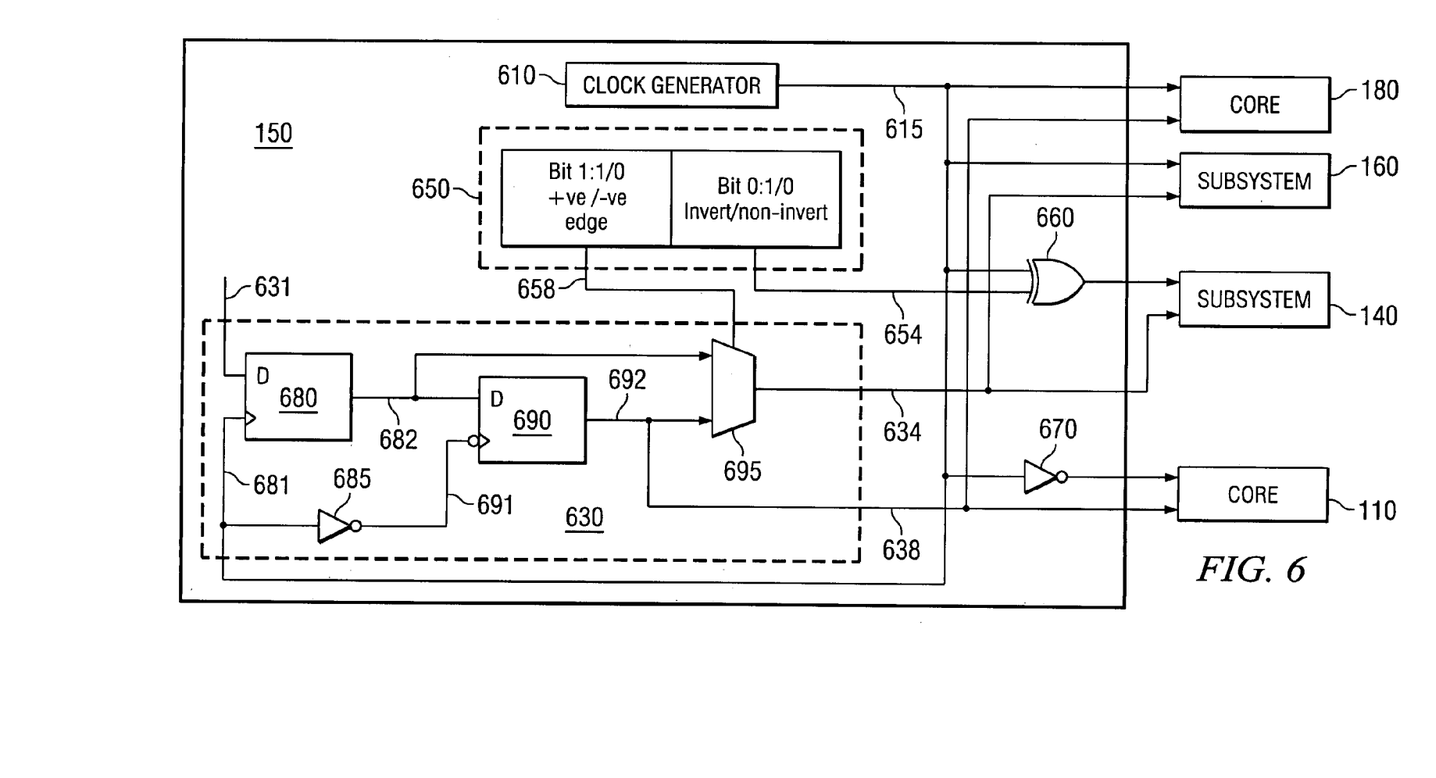
FIG. 6 is a block diagram illustrating the implementation of a test logic, which can be programmed to generate control signals of desired characteristics according to an aspect of the present invention.

The description is continued with reference to the details of an embodiment of test logic 150 which enables modules to be tested in parallel and the paths to be tested at-speed according to several aspects of the present invention.

7. Implementation of Test Logic

FIG. 6 is a block diagram illustrating the implementation of an embodiment of test logic 150, which can be programmed to generate control signals of desired characteristics according to an aspect of the present invention. The block diagram is shown containing clock generator 610, scan enable (SE) signal generator 630, programmable register 650, XOR gate 660, and Inverter 670. Each component is described below in further detail.

Programmable register 650 enables a tester to specify the desired characteristics of the control signals to be provided to subsystem module 140.general, programmable registers may be associated with any module, which can operate with control signals having different characteristics. As described below, such programming can be conveniently used to test modules in parallel and the interconnections at-speed.

Programmable register 650 is shown containing 2 bit fields 'Bit0' and 'Bit1', which may be programmed to a logic 1 or 0. A logic 1 on Bit0 inverts the clock signal (on path 615, original clock) to generate a derived control signal which may be provided to subsystem module 140, and remains unchanged otherwise. A logic 1 on Bit1 enables a rising edge triggered SE signal to be provided to subsystem modules 140 and 160, and a falling edge triggered SE otherwise.

Clock generator 610 generates a clock with characteristics determined by the general design of (non-core IP) IC 100. The clock signal (original clock) may be provided on path 615. Alternatively, the clock signal may be generated externally from a tester.

For illustration, it is assumed that clock generator 610 generates a clock with a phase representing a positive clock (010). On the other hand, as depicted in column 507 of row 540, core module 110 operates on a negative clock signal. Accordingly, inverter 670 operates to invert the clock signal generated by clock generator 610, and the resulting inverted signal is provided as a clock input to core module 110.

However, a negative clock signal may need to be provided to subsystem module 140 as well, to eliminate under-testing and over-testing problems in relation to the example of FIG. 5. Bit0 of programmable register 650 may be set to 0 to provide an inverted clock signal to subsystem module 140, as described below.

XOR gate 660 performs an XOR logical operation of the clock signal received on path 615 and Bit0 (value received on path 654) of programmable register 650, and provides the resulting output (derived clock signal) as a clock signal to subsystem module 140. Assuming Bit0 is set to 1, an inverted clock signal is presented to subsystem module 140, as desired in the illustrative example. However, by setting Bit0 to 0, the clock signal may be provided without inversion, if required to test with other types of IP cores.

Scan enable generator 630 generates a rising or falling edge triggered scan enable (SE) signal according to the bit value received from path 658 (Bit1). The combination of flip-flops 680 and 690 (connected in series), and inverter 685 operate to provide a scan enable signal (received on path 631) phase shifted by 180 degrees. Multiplexor 695 (also contained in scan enable generator 630) selects the original scan enable signal 631 (on path 682) or the phase shifted scan enable signal 692. As may be appreciated, the phase shifted scan enable signal represents falling edge triggered signal if the original signal is rising edge triggered, and vice versa.

Thus, a logic level of 1 or 0 of 'Bit1' (provided on select input to multiplexor 295) may then be conveniently used to select a rising or falling edge triggered SE respectively. The output (derived scan enable signal) of multiplexor 695 is provided as SE input to subsystem module 140 (on path 154-2) and subsystem module 160 (on path 156-2), as indicated in column 509 of rows 530 and 540. It may be appreciated that by programming Bit1 to logic 1 or 0 a SE signal having desired characteristic may be selected.

Accordingly, it may be appreciated that test logic 150 may be programmed to attain control signals of desired characteristics. The desired characteristics may be determined to ensure that paths connecting modules are tested 'at speed' (i.e., at the same speed as in functional mode).description is continued with reference to general approach to selecting desired characteristics of control signals in one embodiment.

8. Selecting Desired Characteristics

As noted above, in one embodiment, the characteristics of control signals of IP core modules may depend on the specific vendor providing the module, and a designer of SOC may need to perform tests within the related constraints. As also noted above, the subsystem modules may be designed to operate with any of multiple characteristics for each control signal. Thus, test logic 150 is programmed with desired characteristics to test paths between module at speed, as described below.

Broadly, the operation of SOC in functional mode determines the speed (T or T/2 in the examples above) at which each path is to be tested. The characteristics of derived control signals for subsystems are selected to test the paths between modules at the same speed as in the functional mode.

The characteristics of the clock and scan enable signals can be controlled differently in the functional mode and the test mode. While in the former mode, the characteristics are derived based upon the required functionality of the individual IP cores, in the latter mode, they are derived based upon the combined requirements of efficient and complete testing across all such IP cores in an SOC.

For example, if the functional characteristics are uniform across all IP cores, the same are sufficient and can be re_used for testing. However, if the functional characteristics differ, then they have to be modified to support simultaneous testing without over_testing or under_testing.

As an illustration, consider IP core Core1 which operates on the rising edges of the scan enable and clock signals, and IP core Core2 which operates on the falling edges of these two signals. For test, therefore, the sub-systems around these cores may have to be clocked differently. They have to be clocked once on the rising edges and once on falling edges. Correct edge selection for the clocks prevents any under_testing or over_testing. Correct edge selection for the generation of scan enable signals allows correct loading and unloading of test data.

The solution described in this application is applicable for a scenario where two IP cores with two different control characteristics are present. This mechanism can be extended to more than two cores. Consider three IP cores. Based on the functional characteristics of these three cores, the test mode characteristics have to be set using the programmable options provided according to various aspects of the present invention. In this case, additional separate controls may be required for the scan enable and clock signal characteristics. However, since there can be only two selections possible for both these signals, two bits will be sufficient in most cases. Additional bits may be required if more control in terms of non_application or selective application of these control signals is required.

In a more general case, with multiple IP cores with multiple control signals with different characteristics, the programmable test logic can be designed as outlined such that all the IP cores are tested adequately. The test logic control generally needs to support different combinations of the control signals in terms of their phases and polarities. Also, wherever the IP and its associated sub_systems require to be tested in parallel, (by virtue of having inter_domain paths), the control signals can be generated appropriately.

However, change in the characteristics of one of the control signals (compared to in functional mode) of the core requires a change in the characteristics of one of the control signals provided to subsystem as well to prevent under-testing or over-testing of paths described above.

As an illustration, it may be noted with reference to FIGS. 3A and 3B that path 114-1 was under-tested since clock signal provided to core module 110 was tested with a 101 clock (as compared to 010 clock in functional mode) and SE remains unchanged. By changing the characteristic of either clock signal or scan enable signal for subsystem module 140, the path may be tested at-speed, as described below with reference to FIG. 7. By using a similar approach, path 114-2 (which was over-tested in FIG. 4B) may also be tested at speed, as described below with reference to FIG. 8.

9. Eliminating Under-Testing of a Path

As may be appreciated from FIG. 3A, subsystem 140 operates with positive clock signal (010) and rising edge of SE signal in functional mode. The under-testing of FIG. 3B was caused as only the clock signal of IP core 110 changed from positive to negative. Path 114-1 may be tested at speed by changing the characteristic of one of clock signal and SE signal of subsystem module 140. Accordingly, in the example scenario of FIG. 7 described below, in comparison to FIG. 3A, the characteristic of subsystem module 140 is also changed from positive (010) to negative (101) to test at speed.

Figure 7:
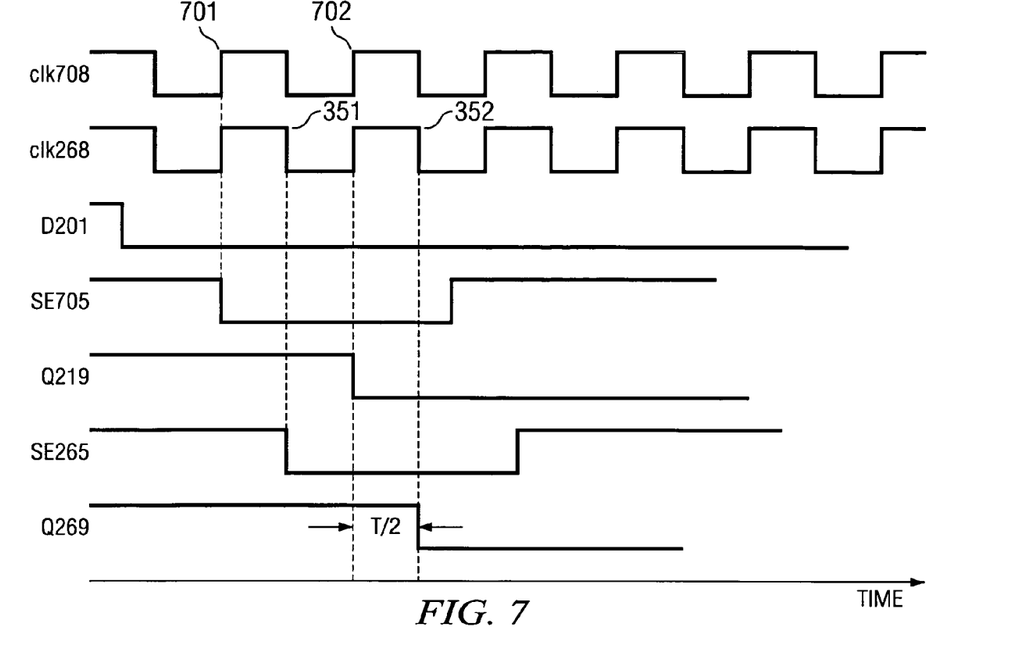
FIG. 7 is a timing diagram of various signals illustrating elimination of under-testing of paths according to an aspect of the present invention.

FIG. 7 is a timing diagram of various signals illustrating elimination of under-testing of paths according to an aspect of the present invention. For illustration, the description is provided with reference to FIGS. 3B, 5 and 6. Only the differences of FIG. 7 as compared to 3B is described below for conciseness.

Clk708 represents a negative clock signal (compared to positive clock clk208 of FIG. 3B) provided as clock input to flip-flop 210 and the generation of clk708 is described in a section above. However, SE705 may be unaltered (i.e., scan enable signal SE705 may be triggered on the rising edge of clk708) compared to the functional mode of FIG. 3A.

At time point 701, SE705 (output of multiplexor 695) provided as SE input to flip-flop 210 is shown changing from logic 1 to 0 (as compared to time point 301 of clk208 of FIG. 3B). The change in SE705 causes flip-flop 210 to capture input data D201 and provide as output Q219 at time point 702 (next rising edge of clk708) as compared to time point 302 of clk208.

The time delay between time points 702 and 352 equals T/2 and is same as the duration depicted in FIG. 3A (functional mode). Thus, under-testing of path 114-1 may be eliminated, which is caused due to testing different modules operating with different characteristics of the control signal.

Figure 8:
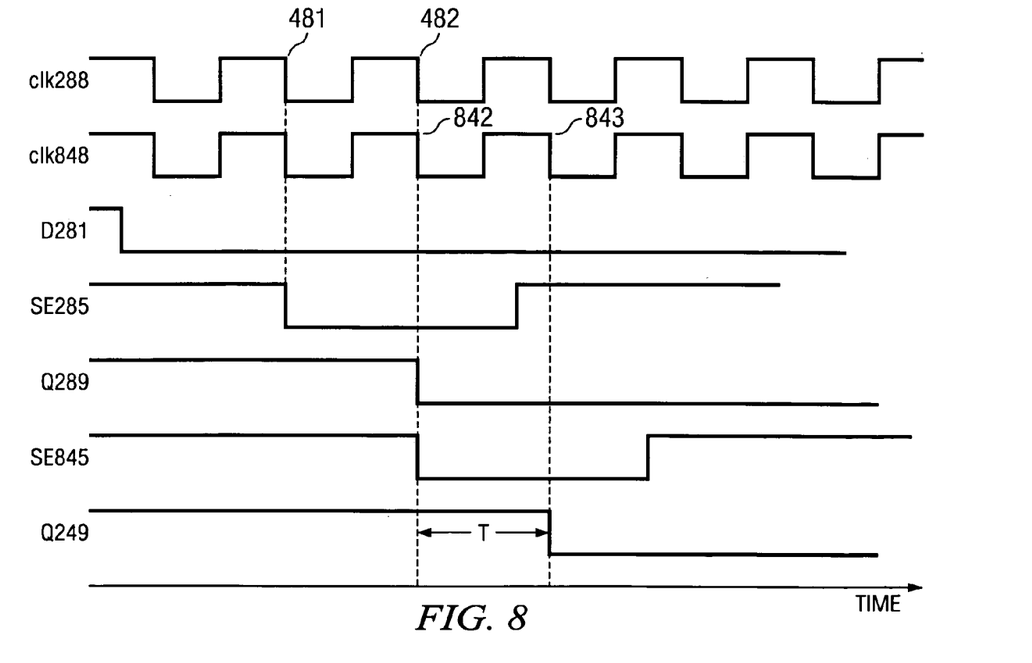
FIG. 8 is a timing diagram of various signals illustrating elimination of over-testing of path according to an aspect of the present invention.

The description is continued with reference to FIG. 8 illustrating the manner in which over-testing of path is eliminated using an approach implemented according to an aspect of the present invention.

10. Eliminating Over-testing of a Path

Over-testing of a path (illustrated in FIG. 4B) may be eliminated by changing (compared to in the functional mode of FIG. 4A) the characteristics of either clock signal or SE signal, for reasons noted above. For illustration, the clock signal is changed from positive (010) to negative (101), and the corresponding clock signals are described below with reference to FIG. 8.

FIG. 8 is a timing diagram of various signals illustrating elimination of over-testing of path according to an aspect of the present invention. For illustration, the description is provided with reference to FIGS. 4B, 5 and 6. Only the differences of FIG. 8 as compared to that of 4B is described for conciseness.

Clk848 represents a negative clock signal (as compared to a positive clock, clk248 of FIG. 4B) provided as clock input (on path 248) to flip-flop 240. Clk848 may be generated conveniently by programming Bit0 as described above.

At time point 842, SE845 provided as SE input to flip-flop 240 is showing changing from logic 1 to 0 (as compared to time point 442 of clk248 of FIG. 4B). The change in SE845 causes flip-flop 240 to capture input data D241 (equaling Q289) and provided as output Q249 at time point 843 (next falling edge of clk848) as compared to time point 443 of clk248.

The time delay between time points 482 and 843 equals T and is same as depicted in FIG. 4A (functional mode). Thus, over-testing of path connecting modules operating with different characteristics of control signals are eliminated conveniently according to an aspect of the present invention.

Thus, under-testing and/or over-testing of paths interconnecting modules may be eliminated using approach(es) described above. As a result, different modules may be tested in parallel causing reduction in the test time.

It may be appreciated that subsystem module 140 can be operated with different characteristics of control signal in different test phases. For example, it may be desirable to test subsystem module 140 with a negative clock while testing the path connecting to core module 110, as described above. However, it may be desirable to test subsystem module 140 with a positive clock while testing some other connected modules (not shown). In general, such situations represent example scenarios in which the characteristics of control signals are not determined beforehand.

11. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

The invention claimed is:

1. A method of testing a plurality of modules in an integrated circuit, said plurality of modules comprising a first module and a second module, wherein data is transferred on a path connecting said first module to said second module wherein said first module and said second module are to be operated together during said testing such that said second module operates using a second one of a plurality of characteristics of a first control signal when said first module is operated using a first one of said plurality of characteristics of said first control signal comprising a clock signal, said method comprising:

providing said second module with a capability of being tested in each of said plurality of characteristics of said first control signal;

providing a bit indicating whether a derived control signal is to be generated as a positive clock signal or a negative clock signal;

generating said derived control signal by performing XOR logical operation of said bit and said clock signal, wherein said derived control signal having a desired characteristic the same as said second one of a plurality of characteristics providing said derived control signal as a control signal to said second module; and testing said second module with said desired characteristic of said first control signal by using said derived control signal.

2. The method of claim 1, wherein said desired characteristic is determined to test said path at a same speed as in a functional mode of operation of said integrated circuit.

3. The method of claim 2, wherein said derived control signal may be generated as an inverted signal of said clock signal.

4. The method of claim 2, wherein said first module comprises a core module provided by a third party not designing said integrated circuit, and said second module is designed by a designer designing said integrated circuit.

5. An integrated circuit comprising:

a first module to be integrated into said integrated circuit, wherein said first module is designed for operation using a first one of a plurality of characteristics of a first control signal comprising a clock signal;

a second module provided with a capability of being tested in each of said plurality of characteristics of said first control signal, said second module being coupled to said first module by at least one path;

a test logic being programmable to generate a derived control signal having a desired characteristic, wherein said derived control signal is generated from said first control signal, and wherein said derived control signal of said desired characteristic is provided as a control signal to said second module and said second module is tested with said desired characteristic of said first control signal by programming said test logic, said test logic comprising:

a bit indicating whether said derived control signal is to be generated as a positive clock signal or a negative clock signal; and an XOR logic gate receiving said bit and said clock signal and generating said derived control signal.

6. The integrated circuit of claim 5, wherein said desired characteristic is determined to test said path at a same speed as in a functional mode.

7. The integrated circuit of claim 6, wherein said test logic can be programmed to generate said derived control signal as an inverted signal of said clock signal.

8. An integrated circuit comprising:

a first module to be integrated into said integrated circuit, wherein said first module is designed for operation using a first one of a plurality of characteristics of a first control signal comprising a scan enable signal;

a second module provided with a capability of being tested in each of said plurality of characteristics of said first control signal, said second module being coupled to said first module by at least one path;

a test logic being programmable to generate a derived control signal having a desired characteristic, wherein said derived control signal is generated from said first control signal, and wherein said derived control signal of said desired characteristic is provided as a control signal to said second module and said second module is tested with said desired characteristic of said first control signal by programming said test logic, said test logic comprising:

a bit indicating whether said derived control signal is to be generated as a rising edge triggered or a falling edge triggered scan enable signal;

a flip-flop coupled to receive said first control signal and being clocked on an inverted clock signal; and a multiplexor selecting either the output of said flip-flop or said first control signal under the control of said bit.

9. The integrated circuit of claim 8, wherein said test logic comprises a register which can be programmed.

10. The integrated circuit of claim 8, wherein said first module comprises a core module provided by a third party not designing said integrated circuit, and said second module is designed by a designer designing said integrated circuit.

* * * * *